(12) United States Patent
Kikuchi et al.

(10) Patent No.: US 7,550,801 B2
(45) Date of Patent: Jun. 23, 2009

(54) NONVOLATILE SEMICONDUCTOR MEMORY DEVICE

(75) Inventors: Shoko Kikuchi, Tokyo (JP); Naoki Yasuda, Yokohama (JP); Koichi Muraoka, Sagamihara (JP); Yukie Nishikawa, Kawasaki (JP); Hirotaka Nishino, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 11/433,422

(22) Filed: May 15, 2006

(65) Prior Publication Data
US 2007/0042547 A1    Feb. 22, 2007

(30) Foreign Application Priority Data
Aug. 16, 2005  (JP) .............. 2005-236014

(51) Int. Cl.
*H01L 29/788* (2006.01)
(52) U.S. Cl. .............. 257/316; 257/E27.078; 438/261
(58) Field of Classification Search ......... 257/316–324, 257/E27.078; 438/257–267
See application file for complete search history.

(56) References Cited

U.S. PATENT DOCUMENTS 6,060,360 A * 5/2000 Lin et al. .......... 438/264
6,803,272 B1 * 10/2004 Halliyal et al. ........ 438/240

FOREIGN PATENT DOCUMENTS

| JP | 58-96589 | 6/1983 |
|---|---|---|
| JP | 5-206475 | 8/1993 |
| JP | 9-260517 | 10/1997 |
| JP | 10-189921 | 7/1998 |
| JP | 10-256400 | 9/1998 |
| JP | 11-109404 | 4/1999 |
| JP | 2000-150680 | 5/2000 |
| JP | 2003-7861 | 1/2003 |
| JP | 2003-197785 | 7/2003 |
| JP | 2005-26590 | 1/2005 |
| JP | 2005-352209 | 12/2005 |

OTHER PUBLICATIONS

Notification of Reasons for Rejection mailed by the Japanese Patent Office on Mar. 10, 2009, for Japanese Patent Application No. 2006-168771, and English-language translation thereof.
Notification of Reasons for Rejection mailed by the Japanese Patent Office on Feb. 3, 2009, for Japanese Patent Application No. 2005-236014, and English-language translation thereof.

* cited by examiner

*Primary Examiner*—Richard A. Booth
(74) *Attorney, Agent, or Firm*—Finnegan, Henderson, Farabow, Garrett & Dunner, L.L.P.

(57) ABSTRACT

A nonvolatile semiconductor memory device includes a tunnel insulating film, a floating gate electrode, an inter-electrode insulating film, and a control gate electrode. The tunnel insulating film is formed on a selected part of a surface of a semiconductor substrate. The floating gate electrode is formed on the tunnel insulating film. At least that interface region of the floating gate electrode, which is opposite to the substrate, is made of n-type Si or metal-based conductive material. The inter-electrode insulating film is formed on the floating gate electrode and made of high-permittivity material. The control gate electrode is formed on the inter-electrode insulating film. At least that interface region of the control gate electrode, which is on the side of the inter-electrode insulating film, is made of a p-type semiconductor layer containing at least one of Si and Ge.

7 Claims, 9 Drawing Sheets

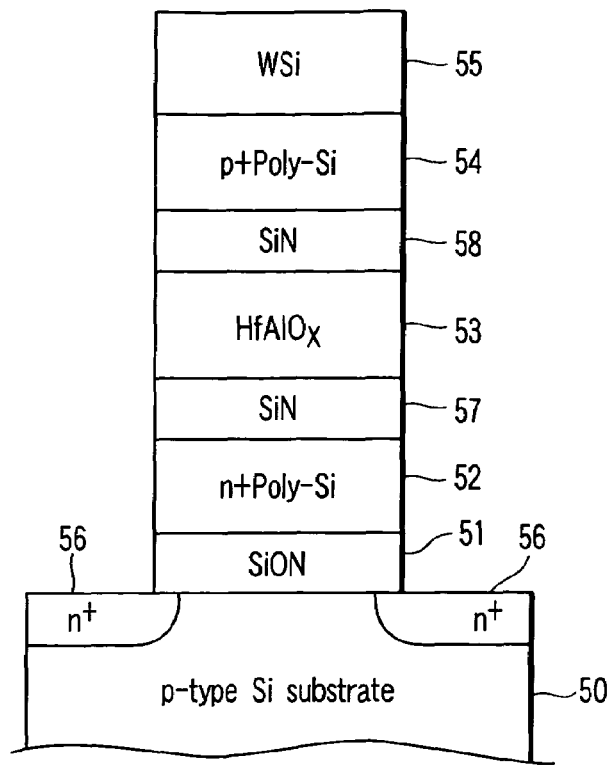
F I G. 15
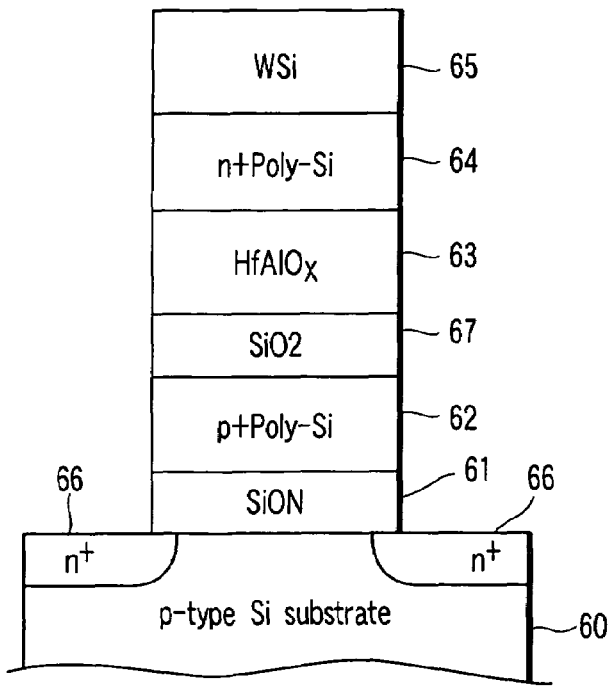
F I G. 16

NONVOLATILE SEMICONDUCTOR MEMORY DEVICE

CROSS-REFERENCE TO RELATED APPLICATIONS

This application is based upon and claims the benefit of priority from prior Japanese Patent Application No. 2005-236014, filed Aug. 16, 2005, the entire contents of which are incorporated herein by reference.

BACKGROUND OF THE INVENTION

1. Field of the Invention

The present invention relates to a nonvolatile semiconductor memory device that achieves improvement of structure of gate parts in a stack-gate configuration including a floating gate electrode and a control gate electrode.

2. Description of the Related Art

Memory cells for use in nonvolatile semiconductor memory devices have a stack-gate structure that is composed of a tunnel insulating film, a floating gate electrode, an inter-electrode insulating film, and a control gate electrode, which are provided on a semiconductor substrate, one upon another in the order mentioned. Write and erase in and from the memory cell is performed by applying a charge into, and taking it charge from, the gap between the tunnel insulating film and the floating gate electrode. Applying the charge taking it are achieved by applying a high voltage between the control gate electrode and the substrate, thereby causing an Fowler-Nordheim (FN) tunnel current to flow.

The threshold voltage is controlled in accordance with whether a charge exists in the floating gate or not, thereby to store data. It is therefore important that the inter-electrode insulating film should have high permittivity, that the coupling ratio should not decrease and that the threshold voltage should not change after data has been written or erased.

Hitherto, SiO2/SiN/SiO2 film (hereinafter referred to as ONO film), which has higher permittivity than silicon oxide film, has been used as inter-electrode insulating film. Recently, it is proposed that material having higher permittivity than ONO film (hereinafter referred to as high-permittivity material) be used. In particular, a high-permittivity oxide film, such as hafnium oxide film or aluminum oxide film, has high thermal stability and very compatible with the steps of manufacturing semiconductor elements. It is therefore expected that a high-permittivity oxide film, such as hafnium oxide film, aluminum oxide film, or film of a mixture of these oxides, will be used as next-generation inter-electrode insulating film. (See Jpn. Pat. Appln. KOKAI Publication 2003-7861.)

If such a high-permittivity insulating film is used, however, an electric charge will be trapped in the inter-electrode insulating film when an electric field is applied. Further, the charge thus trapped will be de-trapped. Inevitably, the threshold voltage will change with time. Consequently, data cannot be fully written into, erased from, or held in, the memory cell as is desired.

If the inter-electrode insulating film is a high-permittivity film, the change of the threshold voltage, which occurs when data is written into, erased from or held in, the memory cell, cannot fall within a range demanded in view of the device specification. Moreover, if a high-permittivity insulating film is used as tunnel-insulating film, as is proposed, similar problems will arise.

BRIEF SUMMARY OF THE INVENTION

An embodiment of this invention is a nonvolatile semiconductor memory device comprising;

a tunnel insulating film which is formed on a surface of a semiconductor substrate;

a floating gate electrode which is formed on the tunnel insulating film, at least an interface region of the floating gate electrode with respect to the substrate, being made of n-type Si or metal-based conductive material;

an inter-electrode insulating film which is formed on the floating gate electrode and which is made of high-permittivity material; and a control gate electrode which is formed on the inter-electrode insulating film, at least an interface region of the control gate electrode with respect to the inter-electrode insulating film, being made of a p-type semiconductor layer containing at least one of Si and Ge.

Another embodiment of the invention is a nonvolatile semiconductor memory device comprising;

a tunnel insulating film which is formed on a surface of a semiconductor substrate;

a floating gate electrode which is formed on the tunnel insulating film, at least an interface region of the floating gate electrode with respect to the substrate, being made of a p-type semiconductor layer containing at least one of Si and Ge;

an inter-electrode insulating film which is formed on the floating gate electrode and which is made of high-permittivity material; and a control gate electrode which is formed on the inter-electrode insulating film, an interface region between the control gate electrode and at least the inter-electrode insulating film being made of n-type Si or metal-based conductive material.

Still another embodiment of the invention is a nonvolatile semiconductor memory device comprising;

a tunnel insulating film which is formed on a surface of a p-type semiconductor substrate and which is made of high-permittivity material;

a floating gate electrode which is formed on the tunnel insulating film, at least an interface region of the floating gate electrode with respect to the tunnel insulating film, being made of a p-type semiconductor layer containing at least one of Si and Ge;

an inter-electrode insulating film which is formed on the floating gate electrode;

a control gate electrode which is formed on the inter-electrode insulating film; and n-type source and drain regions which are formed in the surface of the substrate.

Another embodiment of this invention is a nonvolatile semiconductor memory device comprising;

a tunnel insulating film that is formed on a surface of an n-type semiconductor substrate and which is made of high-permittivity material;

a floating gate electrode which is formed on the tunnel insulating film, at least an interface region of the floating gate electrode with respect to the tunnel insulating film, being made of an n-type Si or metal-based conductive material;

an inter-electrode insulating film which is formed on the floating gate electrode;

a control gate electrode which is formed on the inter-electrode insulating film; and p-type source and drain regions which are formed in the surface of the substrate.

BRIEF DESCRIPTION OF THE SEVERAL VIEWS OF THE DRAWING

FIG. 15 is a sectional view schematically showing the structure of a nonvolatile semiconductor memory cell according to a fifth embodiment of this invention;

FIG. 16 is a sectional view schematically showing the structure of a nonvolatile semiconductor memory cell according to a sixth embodiment of this invention;

DETAILED DESCRIPTION OF THE INVENTION

Figure 1:
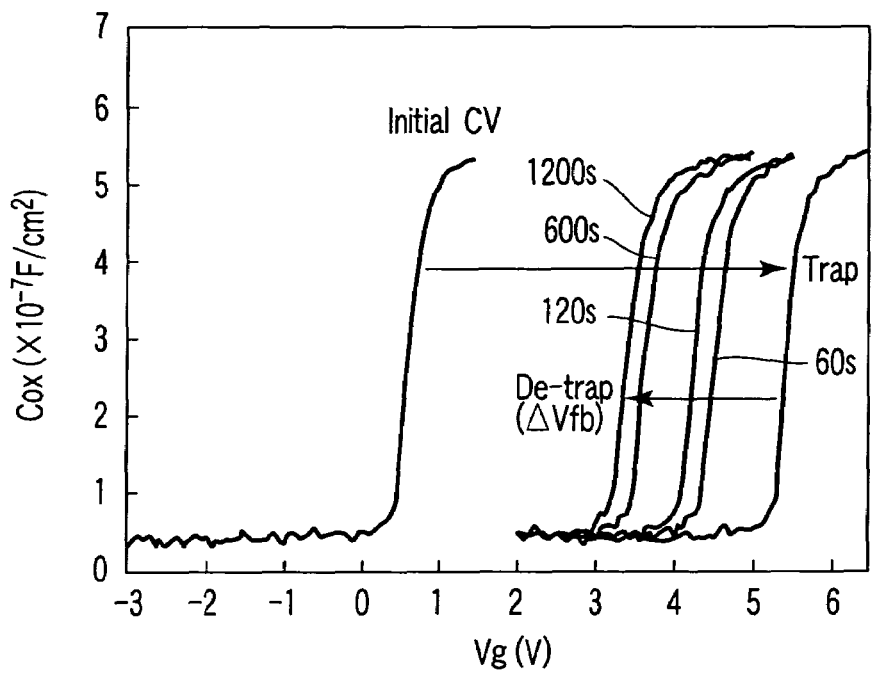
FIG. 1 is a CV characteristic diagram showing trap/de-trap changes that occur before and after the application of a stress to an n+-type polycrystalline Si/HfAlOx/n-type Si substrate structure (MOS capacitor)

Before describing embodiments of this invention, the principle of the invention will be explained.

In nonvolatile semiconductor memory devices, an electric charge is applied into a floating gate electrode and the threshold voltage is changed, whereby data is stored. To this end, the threshold voltage of each memory cell is restricted. More specifically, the threshold voltage changed after data is written or erased should not vary while the data is being held. In the ONO film used as inter-electrode insulating film, the thickness of the oxide films sandwiching the nitride film are set to an appropriate value, thereby suppressing the increase of the threshold value, which results from a leakage current or an electric charge trapped in film.

If a film made of high-permittivity material having higher permittivity than ONO film, such as hafnium oxide film or aluminum oxide film, is used as inter-electrode insulating film, however, the charge trap/de-trap due to defects in the insulating film causes flat-band voltage shift. Hence, the change of threshold value caused by the flat-band voltage shift ($V_{fb}$ shift) in data retention has become a great problem. The permissible value of the flat-band voltage shift defined from the present device specification is about 0.1 V in a ten-year guarantee.

The inventors think that hafnium aluminate (HfAlOx) is preferred as material of the inter-electrode insulating film. Therefore, the element experiments on MOS capacitors made of HfAlOx single layer was conducted. The results of the experiments show the following.

At first, the time variation of the $V_{fb}$ shift was measured in an n+-type polycrystalline Si/HfAlOx/n-type Si substrate structure, which is a conventional memory cell structure that uses a high-permittivity film as inter-electrode insulating film. An HfAlOx film about 20 nm thick was formed on an n-type Si substrate by means of the ALD (atomic layer deposition) method and an n+-type polycrystalline Si film was deposited on the HfAlOx film, thus fabricating an MOS capacitor. Using this sample, the change of the $V_{fb}$ shift that occurred after the application of a stress was examined.

First, the CV measurement was carried out before applying the electric field stress. Then, an electric field of 15 MV/cm was applied from the gate for one second, as write-equivalent stress of positive polarity. After the stress removal, the CV curve was measured under the low electric field (3.5 MV/cm), as charge retention equivalent stress of positive polarity. Then, by comparing with $V_{fb}$ obtained from CV measurement immediately after stress removal, time change of the $V_{fb}$ shifts in charge retention state was investigated. Note that the difference between $V_{fb}$ measured immediately after the CV measuring and $V_{fb}$ measured immediately after the stress application is defined as trap amount, and difference between $V_{fb}$ measured immediately after the stress application and $V_{fb}$ measured after the structure upon was thereafter left to stand for a predetermined time is defined as an amount of de-trap.

As a result, the initial CV greatly shifted in the positive direction by the stress application, as illustrated in FIG. 1. After the stress was removed, the CV curve shifted in the negative direction at a constant low electric field. This is probably because the electrons trapped by the stress application were de-trapped from the HfAlOx film when the stress was removed.

Figure 2:
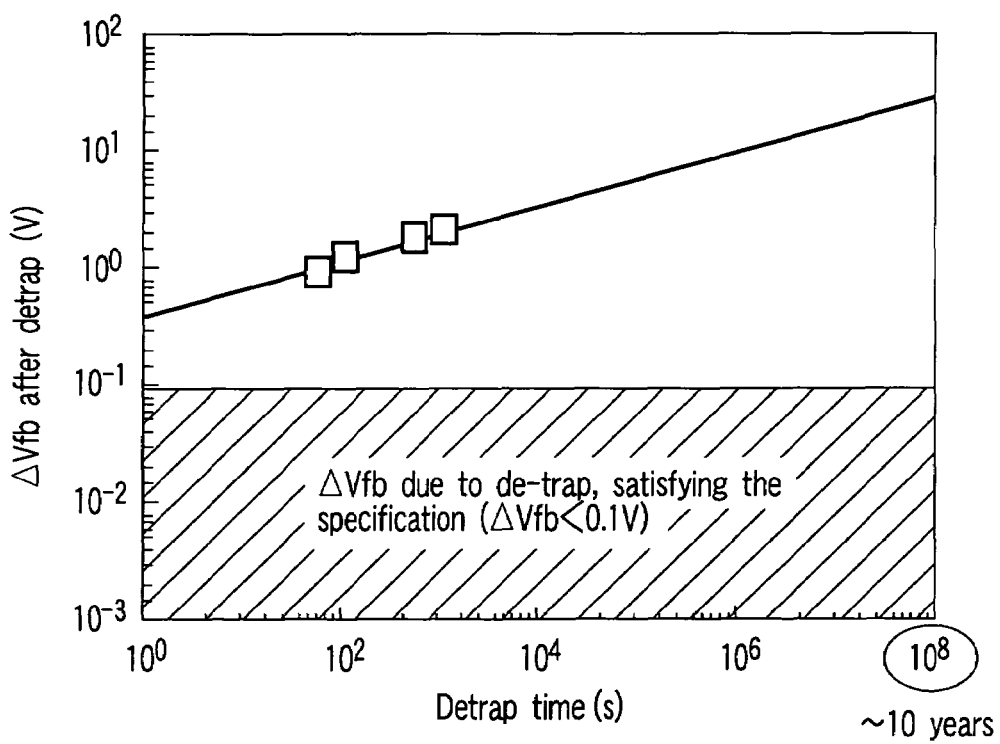
FIG. 2 is a characteristic diagram showing how $V_{fb}$ shift changes with time in the n+-type polycrystalline Si/HfAlOx/n-type Si substrate structure (MOS capacitor)

FIG. 2 is a characteristic diagram showing how the $V_{fb}$ shift obtained from the CV curve (FIG. 1) changes with time. This result shows that the n+-type polycrystalline Si/HfAlOx/n- type Si substrate structure cannot meet at all the specification describing that the flat-band voltage shift should be about 0.1 V.

On the other hand, HfAlOx films having thickness of 20 nm were deposited on a p-type Si substrate by means of the ALD method, whereby MOS capacitors using different gate-electrode materials were manufactured. Time change of the $V_{fb}$ shift obtained from CV curve was investigated by the same measuring method as the above.

At this time, a gate voltage of negative polarity was applied.

Figure 3:
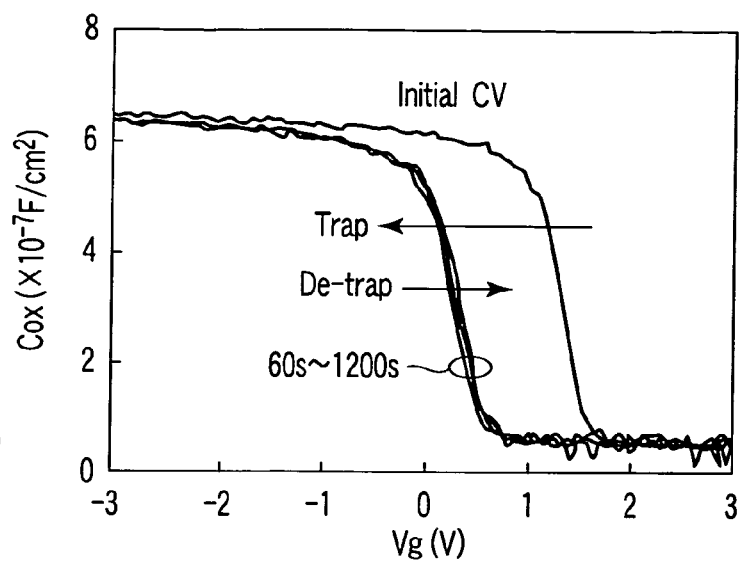
FIG. 3 is a CV characteristic diagram showing trap/de-trap changes that occur before and after the application of a stress to an Au electrode/HfAlOx/p-type Si substrate structure if the work function of the gate electrode is varied.
Figure 4:
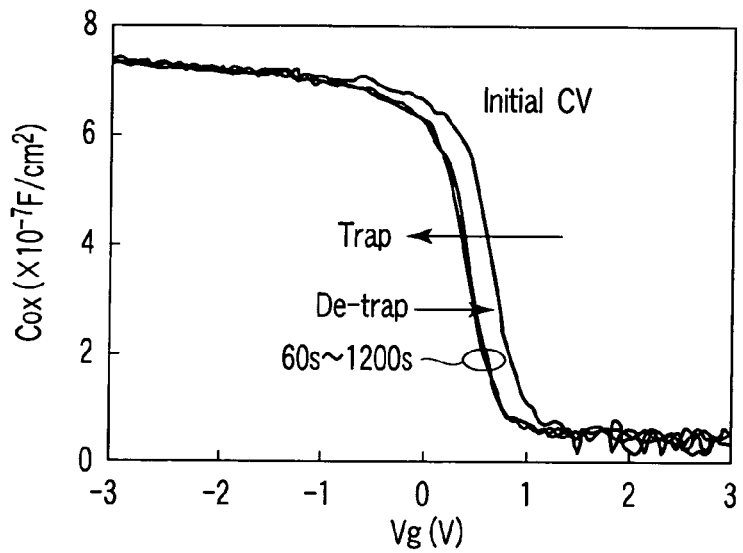
FIG. 4 is a CV characteristic diagram showing trap/de-trap changes that occur before and after the application of a stress to an Mo electrode/HfAlOx/p-type Si substrate structure if the work function of the gate electrode is varied.
Figure 5:
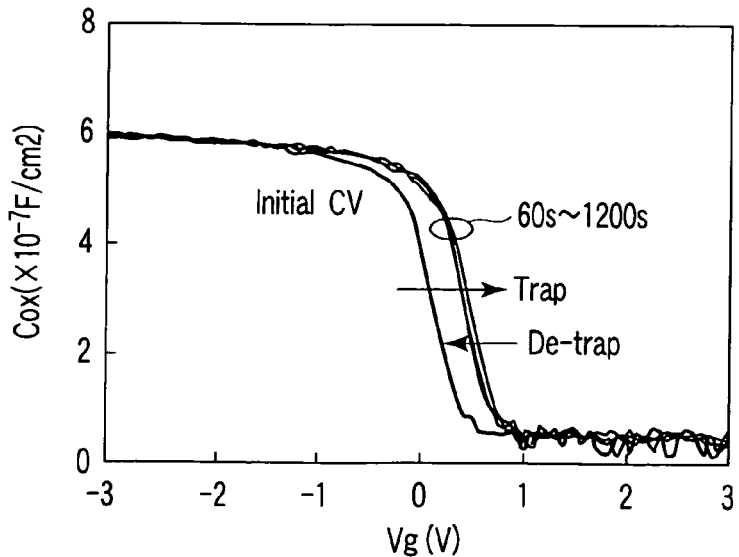
FIG. 5 is a CV characteristic diagram showing trap/de-trap changes that occur before and after the application of a stress to an Al electrode/HfAlOx/p-type Si substrate structure if the work function of the gate electrode is varied.
Figure 6:
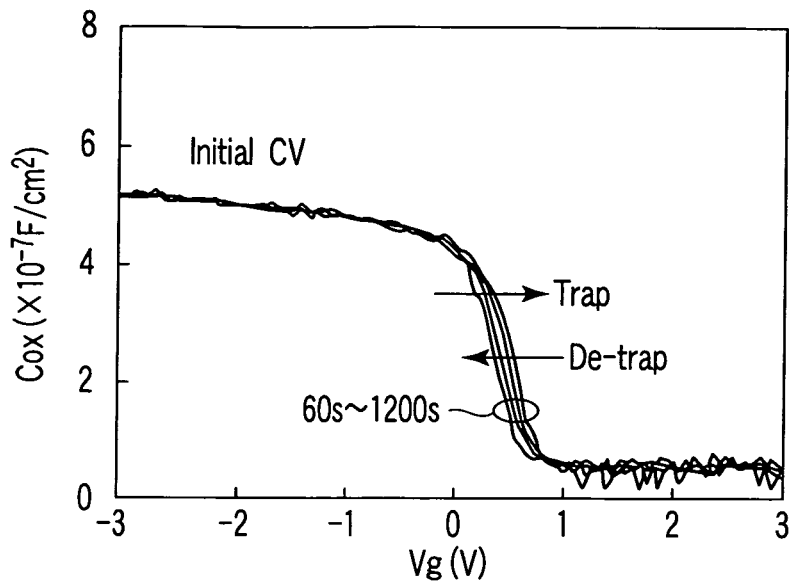
FIG. 6 is a CV characteristic diagram showing trap/de-trap changes that occur before and after the application of a stress to an n-type polycrystalline Si/HfAlOx/p-type Si substrate structure if the work function of the gate electrode is varied.

FIGS. 3 to 6 show CV curves pertaining to various materials used for gate electrodes in the present invention. The curves on the de-trap side, shown these figures, correspond to those for 60 s, 120 s, 600 s and 1200 s, respectively. FIG. 3 relates to a case that uses an Au electrode (work function: about 5.1 eV). FIG. 4 relates to a case that uses an Mo electrode (work function: about 4.7 eV). Further, FIG. 5 relates to a case that uses an Al electrode (work function: about 4.1 eV), and FIG. 6 relates to a case that uses n$^+$-type polycrystalline Si (work function: about 3.95 eV). The result of the experiment shows that a CV shifts due to de-trap was scarcely observed, regardless of the material used for the electrode. On the other hand, the smaller the work function, the more the amount of trap decreased. This confirms that the amount of trap depends on the electrode.

Figure 7:
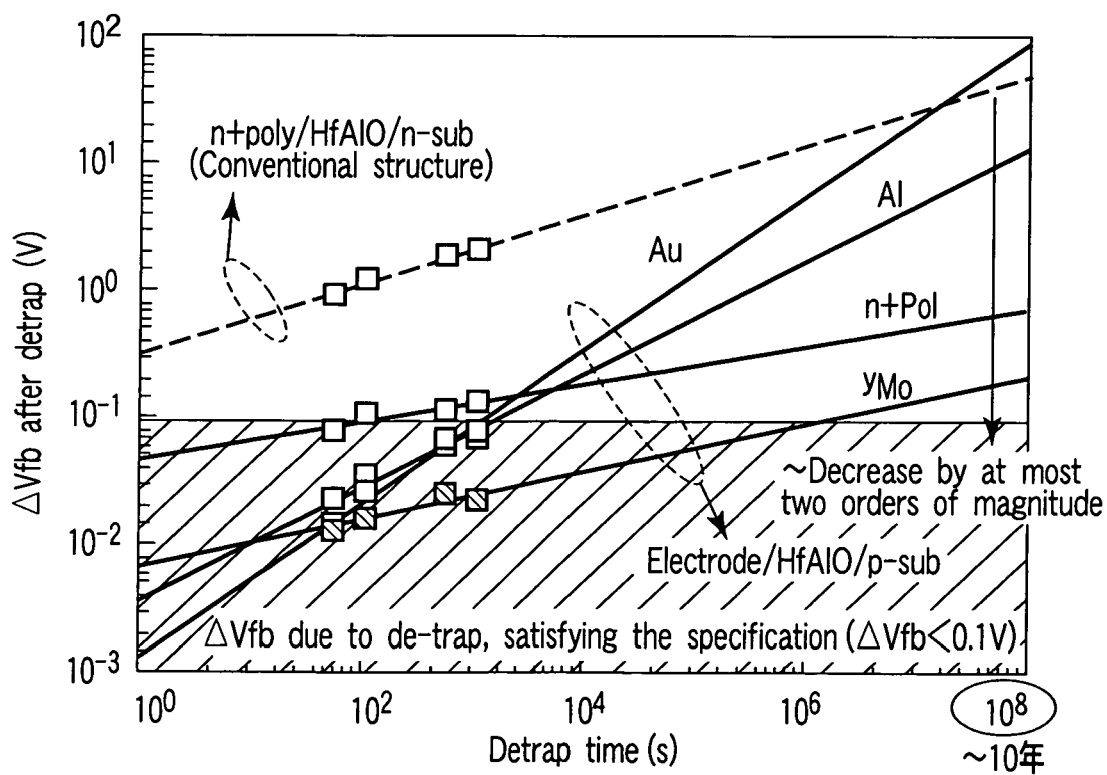
FIG. 7 is a characteristic diagram showing how $V_{fb}$ shift changes with time in a MOS capacitor of electrode/HfAlOx/p-type Si substrate structure if the work function of the gate electrode is varied.

FIG. 7 illustrates the results obtained from the CV curves (FIGS. 3 to 6). FIG. 7 also shows how the $V_{fb}$ shift changes with time (FIG. 2) in the n$^+$-type polycrystalline Si/HfAlOx/n-type Si substrate that is used in the conventional structure. This result shows that the de-trap characteristic is improved by at most two orders of magnitude over the conventional structure if it is an n$^+$-type polycrystalline Si or a metal electrode/HfAlOx/p-type Si substrate structure.

This is probably because, since correlation is observed between the amount of trap and the work function of the electrode, the positive charge and the negative charge compensate for each other as holes and electrons are injected from the p-type electrode and the n-type electrode, respectively, and the electric charge contributing to the trap/de-trap therefore decreases in amount. So that means the simultaneous injection of holes and electrons can suppress $V_{fb}$ shift caused by charge trap/de-trap.

The result of the experiment described above reveals that the $V_{fb}$ shift is greatly reduced compared with the conventional structure, which is n+-type polycrystalline Si/HfAlOx/n-type Si substrate structure by interposing high-permittivity insulating film between n-type electrode and p-type electrode.

Preferably, the inter-electrode insulating film is one that has an appropriately high permittivity. This is because the leakage current cannot be effectively reduced if the specific permittivity of the high-permittivity insulating film is too low, and the inter-cell interference is caused if the permittivity is too high. In view of this, material that has permittivity of about 15 to 30 is desirable. Material that exhibits such permittivity is, for example, oxide, nitride or oxinitride that contains at least one element selected from the group consisting of Al, Hf, La, Y, Ce, Ti, Zr and Si. In particular, material whose main component is Hf or La is desirable because it has an appropriately high permittivity, a large barrier height, high thermal stability and low reactivity with interfaces. Specifically, HfAlOx, HfAlON, LaAlOx, LaAlON etc. are desirable as optimal material of the inter-electrode insulating film.

Since the high-permittivity insulating film is interposed between the p-type electrode and the n-type electrode, it is possible to reduce the amount of trap/de-trap in the high-permittivity insulating film. At this time, however, the electrons to be injected from the n-type electrode and the holes to be injected from the p-type electrode must be controlled independently so that the electrons and the holes may be balanced in numbers.

One method is to use a p-type electrode made of SiGe. The bandgap in SiGe changes in accordance with the Ge concentration. Particularly, the Ge concentration influences the energy level of the valence band. The higher the Ge concentration, the more the barrier height to holes will increase. Hence, the number of holes to be injected can be controlled by changing the SiGe composition ratio.

The number of holes and electrons to be injected can be controlled by interposing an insulating layer between the p-type electrode and the high-permittivity insulating film, said member having a larger barrier height than the high-permittivity insulating film and made of material that exhibits asymmetric band-offset. In this regard, it is important that the number of electrons and holes to be injected can be easily controlled because the layer interposed exhibits asymmetric band-offset. If the thickness of the layer interposed may be changed. In this case, too, the number of electrons and holes to be injected can be changed.

The number of electrons to be injected can be controlled by changing the work function of the n-type electrode. The larger the work function, the more the leakage current following in the high-permittivity insulating film is decreased. Hence, it is desired that the work function is as large as possible. The reduction of trap/de-trap depends of the number of holes. Therefore, the n-type electrode can be made of a variety of metal-based conductive materials. It may be made of, for example, metal selected from the group consisting of Au, Pt, Co, Be, Ni, Rh, Pd, Te, Re, Mo, Al, Hf, Ta, Mn, Zn, Zr, In, Bi, Ru, W, Ir, Er, La, Ti and Y; metal compound that contains at least one element selected from this group; or silicide, boride, nitride or carbide that contains at least one of the elements selected from this group.

Figure 8:
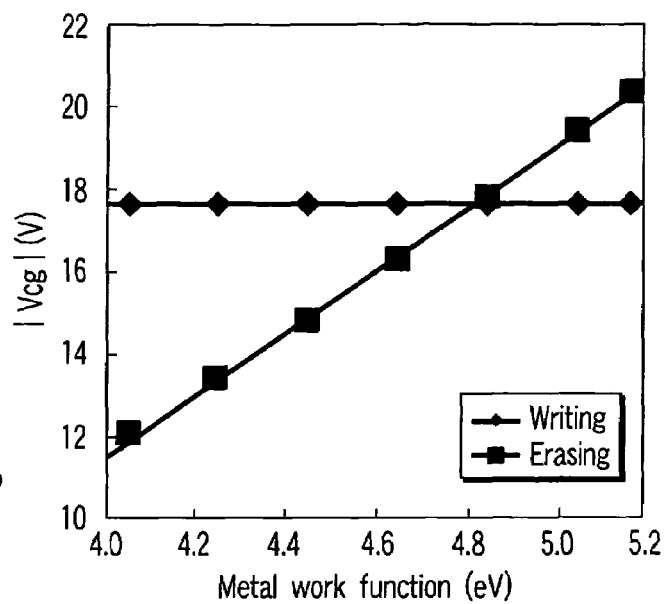
FIG. 8 is a characteristic diagram showing the result of write/erase simulation performed on a typical stack-cell structure.

More preferably, the metal-based conductive material is one that has work function of 4.8 eV or less, because the floating gate electrode may be made of metal-based conductive material, too. The quantitative reason for this is as follows. FIG. 8 is a characteristic diagram showing the result of write/erase simulation performed on a typical stack-cell structure, i.e., a structure composed of p$^+$-type polycrystalline Si/HfAlOx (permittivity: 20; film thickness: 25 nm)/metal-based conductive member/SiO$_2$ (permittivity: 3.9; film thickness: 7.5 nm)/p-type substrate, and having a coupling ratio of 0.6. In the simulation, the initial current density in the tunnel insulating film was set to 10 A/cm$^2$ in order to ensure a desired write/erase speed. The voltage that should be applied to the control gate electrode to write and erase data under this condition was calculated by varying the work function of the metal-based conductive material. As seen the results shown in FIG. 8, if the floating gate electrode has work function larger than 4.8 eV, the absolute value of the voltage applied to the control gate electrode to erase data is higher than the voltage applied to write the data. In terms of cost-performance, it is not advisable to provide a high power-supply voltage for the data-erasing only. It is therefore desired that the metal-based conductive material of the floating gate electrode should have work function of 4.8 eV or less. More specifically, the floating gate electrode should better be made of TiN (4.6 eV), W (4.2 to 4.8 eV), WSi (4.3 eV), TaN (4.4 eV), WN (4.8 eV), TaSiN (4.25 eV) or the like (see Y. S. Suh et al., VLSI Symp. 2001, p 47).

Embodiments of the present invention will be described in detail, with reference to the accompanying drawings.

First Embodiment

Figure 9:
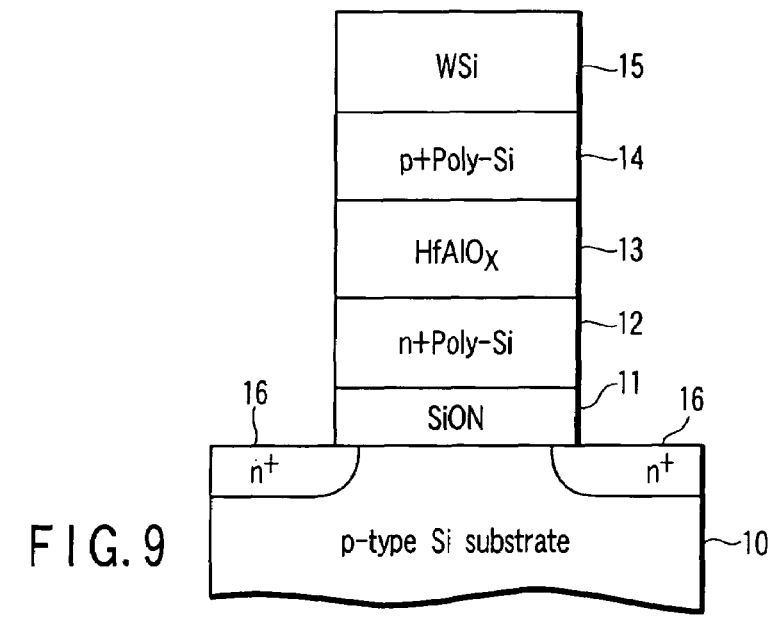
FIG. 9 is a sectional view schematically showing the structure of a nonvolatile semiconductor memory cell according to a first embodiment of the present invention.

FIG. 9 is a sectional view schematically showing the structure of a nonvolatile semiconductor memory cell according to a first embodiment of the present invention. More precisely, FIG. 9 shows one of the cells of, for example, an NAND-type nonvolatile semiconductor memory device.

On a p-type Si substrate 10, a floating gate electrode 12 made of $n^+$-type polycrystalline Si layer is formed through a tunnel insulating film 11 made of thermally oxidized nitride film (SiON film). An inter-electrode insulating film 13 made of HfAlOx is formed on the floating gate electrode 12. A lower control gate electrode 14 made of $p^+$-type polycrystalline Si is formed on the $n^+$-type polycrystalline Si. On the $n^+$-type polycrystalline Si, an upper control gate electrode 15 made of W silicide is formed. Note that the $n^+$-type polycrystalline Si is not limited to a bulk substrate. It may, of course, be a p-type well that is formed on, for example, an n-type Si substrate.

The tunnel insulating film 11 has thickness of 7 nm to about 8 nm. The $n^+$-type polycrystalline Si layer used as floating gate electrode 12 has thickness of 30 nm to about 60 nm. The $p^+$-type polycrystalline Si layer used as control gate electrode 14 has thickness of 30 nm to about 60 nm. The HfAlOx layer used as inter-electrode insulating film 13 has thickness of about 10 nm to about 30 nm. As is known in the art, $n^+$-type polycrystalline Si has work function of about 4 eV, and $p^+$-type polycrystalline Si has work function of about 5 eV. W silicide has lower resistivity than $p^+$-type polycrystalline Si.

In this embodiment, the floating gate electrode 12 is made of $n^+$-type polycrystalline Si. Instead, it may be made of metal selected from the group consisting of Au, Pt, Co, Be, Ni, Rh, Pd, Te, Re, Mo, Al, Hf, Ta, Mn, Zn, Zr, In, Bi, Ru, W, Ir, Er, La, Ti and Y or metal compound that contains at least one element selected from this group. Alternatively, the electrode 12 may be made of metal-based conductive material such as silicide, boride, nitride or carbide of any metal selected from this group.

In this embodiment, the lower control gate electrode 14 is made of $p^+$-type polycrystalline Si. Instead, the electrode 14 may be made of a Ge layer or made of $p^+$-type semiconductor material in which Ge added to Si.

In the present embodiment, the upper control gate electrode 15 that is laid on the $p^+$-type polycrystalline Si layer is made W silicide. Instead, the electrode 15 may be made of low-permittivity silicide, such as Ni silicide or Co silicide, or made of various metal-based conductive materials.

In this embodiment, the high-permittivity inter-electrode insulating film 13 is made of HfAlOx. Instead, inter-electrode insulating film 13 may be made of oxide, nitride or oxinitride that contains at least one element selected from the group consisting of Al, Hf, La, Y, Ce, Ti, Zr, Si and Ta, or may be a multi-layer structure that is composed of these films. Further, the film 13 may be a multi-layer structure that is composed of these high-permittivity insulating films and an Si oxide film, an Si oxinitride film or a nitride film.

In this embodiment, the floating gate electrode 12 and the control gate electrode 14 are made of polycrystalline Si. Their material need not be limited, nevertheless, because it suffices to interpose the inter-electrode insulating film 13 between the p-type electrode and the n-type electrode. For example, the floating gate electrode 12 may be made of metal material, not $n^+$-type polycrystalline Si, and an $n^+$-type polycrystalline Si layer may be interposed at the interface between the inter-electrode insulating film 13 and the floating gate electrode 12. Similarly, the control gate electrode 14 may be made of metal material, not $p^+$-type polycrystalline Si, and a $p^+$-type polycrystalline Si layer may be interposed at the interface between the inter-electrode insulating film 13 and the floating gate electrode 12.

Figure 10:
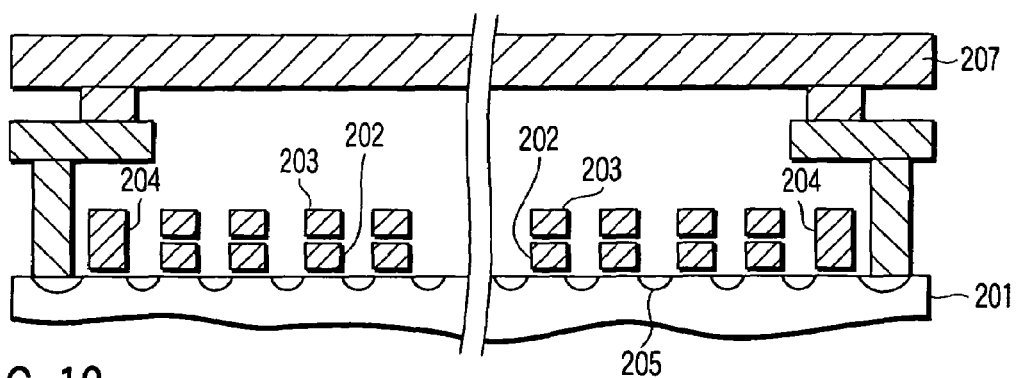
FIG. 10 is a sectional view showing the element structure of a NAND-type nonvolatile semiconductor memory cell.

FIG. 10 is a sectional view a NAND-type nonvolatile semiconductor memory cell. In FIG. 10, reference numbers 201, 202, 203, 204, 205 and 207 indicates a Si substrate, a floating gate, a control gate, a selecting gate, a diffusion layer, and a bit line, respectively. If this embodiment is applied to a NAND-type nonvolatile semiconductor memory device, the selecting gate 204 should better be a single layer identical to the control gate or to the layer interposed at the interface between the control gate and the inter-electrode insulating film. This is because, in the steps of fabricating ordinary nonvolatile semiconductor memory cells, a $p^+$ Si electrode and an $n^+$ Si electrode directly contact each other at the selecting gate if the control gate and the floating gate are different from each other. Consequently, a depletion layer will develop in each electrode, making it impossible to apply a desirable voltage.

FIGS. 11A to 11E are sectional views explaining the steps of manufacturing the present embodiment. The left and right parts of each of these figures show, respectively, two cross-sections that intersect with each other. That is, the left part shows a cross section taken along the gate length direction, and the right part shows a cross section taken along the gate width direction.

First, as shown in 11A, an SiON film 102 (11) about 7 nm to 8 nm thick, which was to be tunnel insulating film, was formed by thermal oxidation on a p-type Si substrate 101 (10) doped with desired impurities. Then, an $n^+$-type polycrystalline Si layer 103 (12), which was doped with phosphorus and 60 nm thick and was to be a floating gate electrode, was deposited by chemical vapor deposition (CVD). The temperature at that time was 620° C. Subsequently, a mask member 104 for element isolation was deposited by CVD.

Then, reactive ion etching (RIE) was carried out, using a resist mask (not shown). The mask member 104, polycrystalline Si layer 103 and SiON film 102 were thereby etched, one after another. Then, the exposed part of the Si substrate 101 was etched, thus making an element-isolating groove 106 that was 100 nm deep.

Figure 11A:
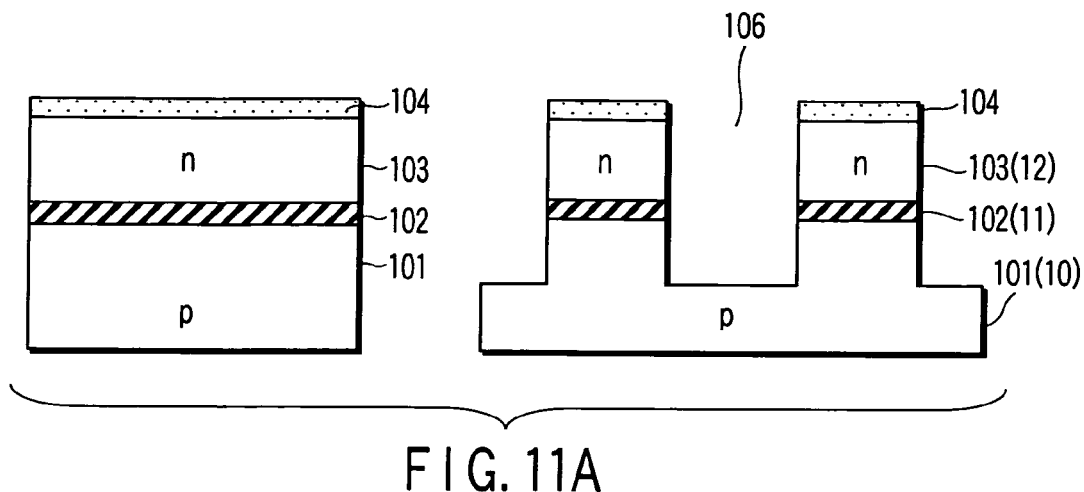
FIGS. 11A to 11E are sectional views explaining the steps of manufacturing a nonvolatile semiconductor memory cell according to the first embodiment of this invention.
Figure 11B:
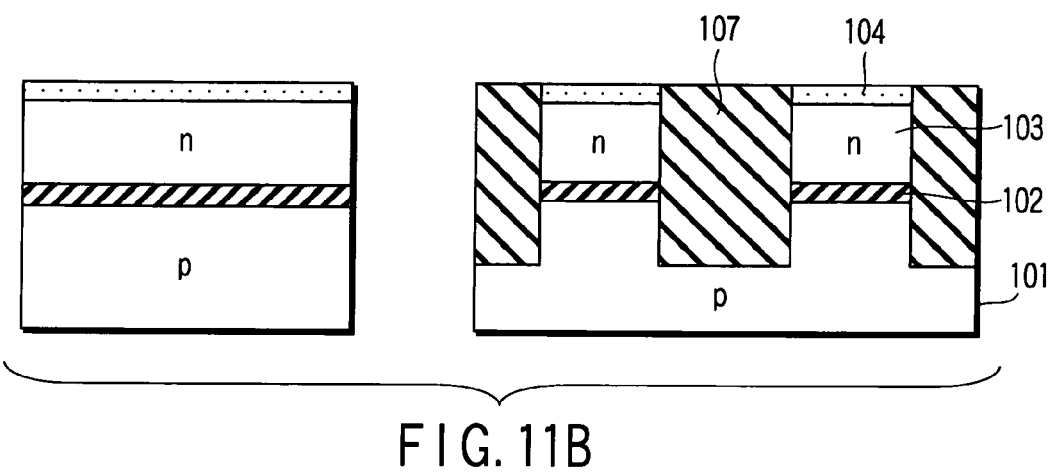

As FIG. 11B shows, a silicon oxide film 107 for isolating elements was deposited on the entire surface of the resulting structure, completely filling the element-isolating groove 106. Thereafter, the surface region of the silicon oxide film 107 was removed by chemical mechanical polishing (CMP), thus rendering the surface of the structure flat. At this time, the upper surface of the mask member 104 was exposed.

Figure 11C:
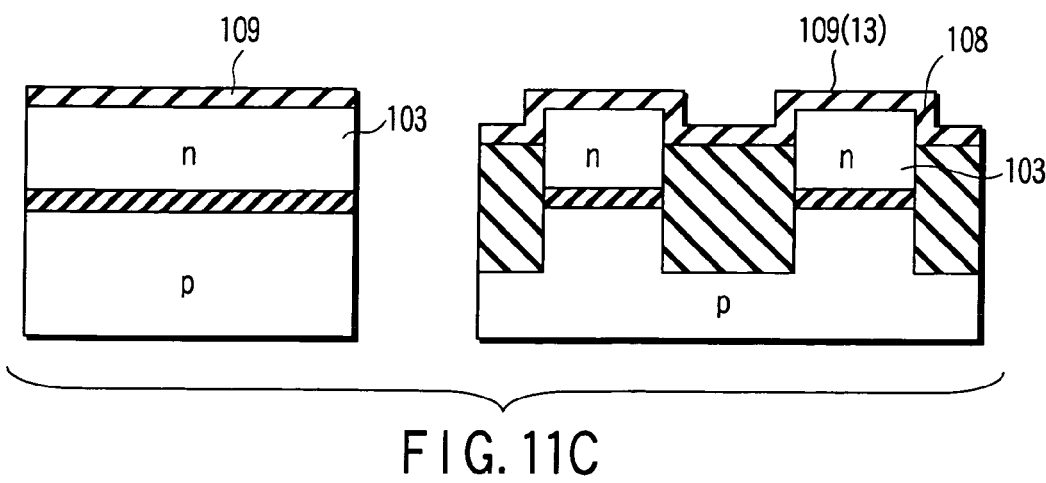

As FIG. 11C shows, the mask member 104 exposed was removed by etching. Then, the exposed surface region of the polycrystalline silicon layer 103 was etched with a diluted hydrofluoric acid solution and was thereby removed. The sides 108 of the polycrystalline silicon layer 103 were thereby exposed. Thereafter, a hafnium aluminate (HfAlOx) film 109 (13) having thickness of 15 nm was formed on the entire surface of the resulting structure. The HfAlOx film 109 was formed by means of the ALD method at 250° C., by using $Al(CH_3)_3$, $Hf[N(CH_3)_2]_4$ and $H_2O$ as materials. Subsequently, annealing was carried out at 1000° C. in an $N_2$ atmosphere of 1 atmospheric pressure.

Figure 11D:
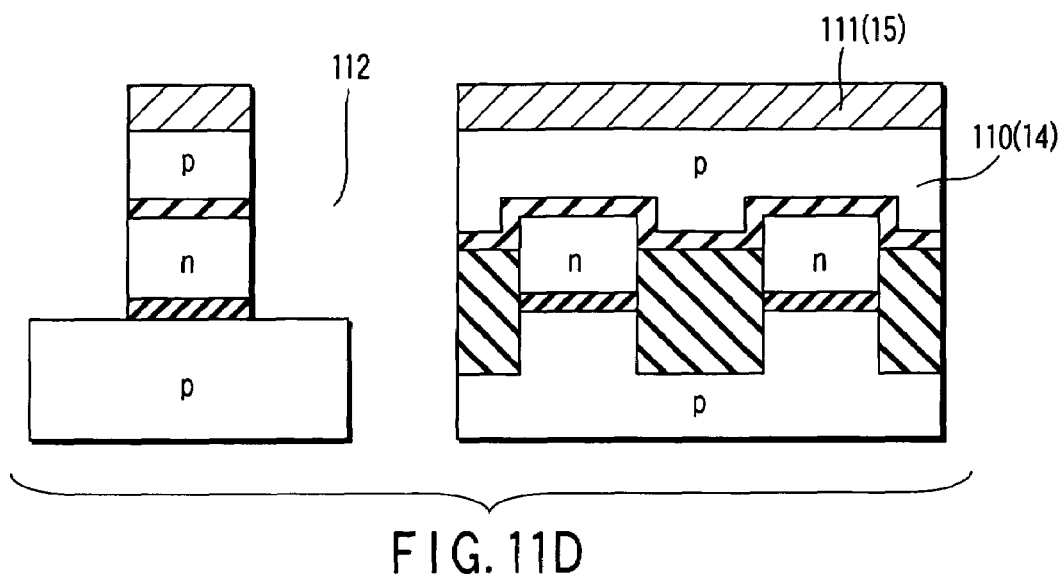

Next, as shown in FIG. 11D, a $p^+$-type polycrystalline Si layer 110 (14), which was doped with boron and to be used as control gate electrode, was deposited by CVD at 620° C. A WSi layer 111 (15) was formed on the Si layer 11. A conductive layer was thereby formed, which was composed of two layers, i.e., a WSi layer and a polycrystalline Si layer, and had thickness of 100 nm. Note that the WSi layer 111 was formed first by depositing W by CVD using $W(CO)_6$ gas as feed gas and then by converting the polycrystalline silicon layer to an WSix layer in the subsequent heat process.

The methods of forming these films are not limited to those described above. Other feed gases may be used. Further, instead of ALD and CVD, other methods, such as sputtering, vapor deposition, laser abrasion, MBE method, or any possible combination of these methods, may be performed.

Subsequently, RIE method using a resist mask (not shown) was carried out, etching the WSi layer 111, polycrystalline Si layer 110, HfAlOx film 109, polycrystalline Si layer 103 and SiON film 102 one after another. Thus, a floating gate electrode and a control gate electrode were formed, each in a specific shape.

Figure 11E:
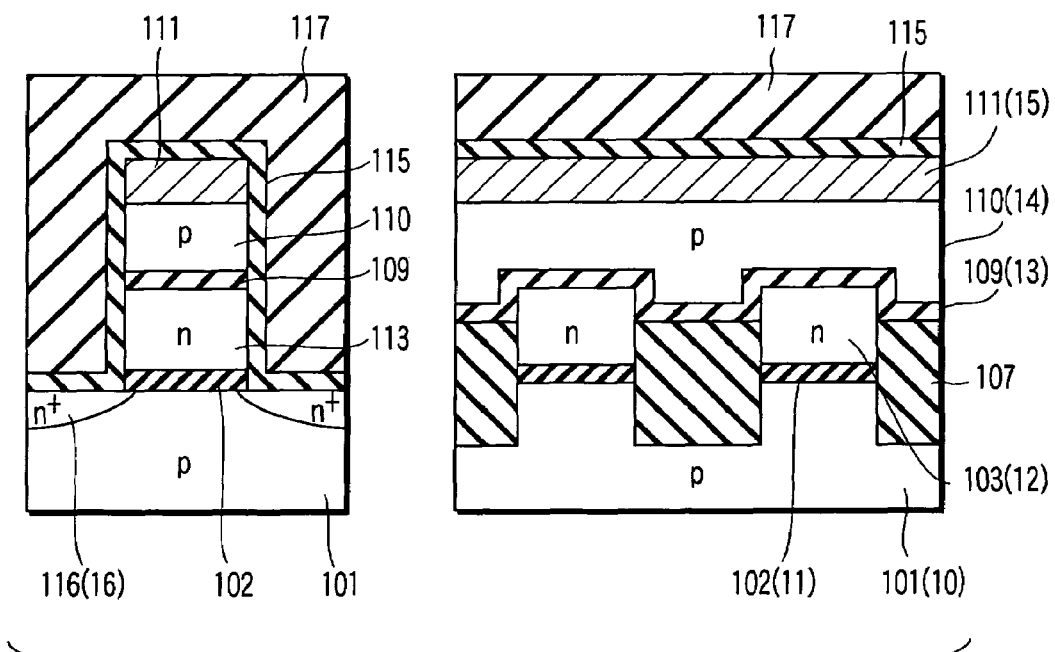

As FIG. 11E shows, a silicon oxide film 115 called electrode-side oxide film was formed on the exposed surface of the resulting structure. Ion implantation was performed, forming an $n^+$-type source/drain diffusion layer 116 (16). Further, an interlayer insulating film 117 made of, for example, silicon oxide was formed by CVD, covering the entire surface of the structure. Thereafter, wiring layers were formed by the method known in the art. A nonvolatile memory cell was thus fabricated.

In the present embodiment, as described above, the HfAlOx film, i.e., high-permittivity insulating film used as inter-electrode insulating film is interposed between the $n^+$-type polycrystalline Si layer used as floating gate electrode 12 and the $p^+$-type polycrystalline Si layer used as control gate electrode 14. Hence, the charge trap/de-trap after the application of a voltage can be decreased. Therefore, the performance and reliability of memory cell is improved by decreasing the flat-band voltage shift in charge retention state. The configuration described above is advantageous because of being implemented merely by selecting appropriate conductivity types for the polycrystalline silicon of the floating gate electrode 12 and that of the control gate electrode 14.

Second Embodiment

Figure 12:
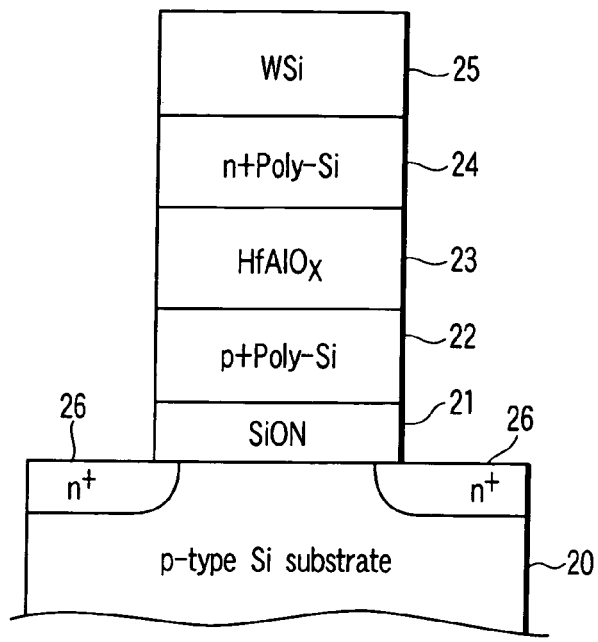
FIG. 12 is a sectional view schematically showing the structure of a nonvolatile semiconductor memory cell according to a second embodiment of this invention.

FIG. 12 is a sectional view schematically showing the structure of a nonvolatile semiconductor memory cell according to a second embodiment of this invention. Reference numbers 20 to 25 in FIG. 12 correspond to reference numbers 10 to 15 in FIG. 9, respectively. However, the components 22 and 24 have conductivity types opposite to those of the components 12 and 14.

This embodiment differs from the first embodiment in the conductivity types of the floating gate electrode and control gate electrode. In this embodiment, the floating gate electrode 22 is made of $p^+$-type polycrystalline Si, and the control gate electrode 24 is made of $n^+$-type polycrystalline Si. The embodiment is fabricated in almost the same method as the first embodiment. To form the floating gate electrode 22, it suffices to deposit a polycrystalline Si layer doped with boron. To form the control gate electrode 24, it suffices to deposit a polycrystalline Si layer doped with phosphorus.

In this configuration, too, an HfAlOx film, which is a high-permittivity insulating film used as inter-electrode insulating film 23, is interposed between the $p^+$-type polycrystalline Si layer used as floating gate electrode 22 and the $n^+$-type polycrystalline Si layer used as control gate electrode 24. The charge trap/de-trap after the application of a voltage can therefore be decreased. Hence, the second embodiment can attain the same advantage as the first embodiment.

Third Embodiment

Figure 13:
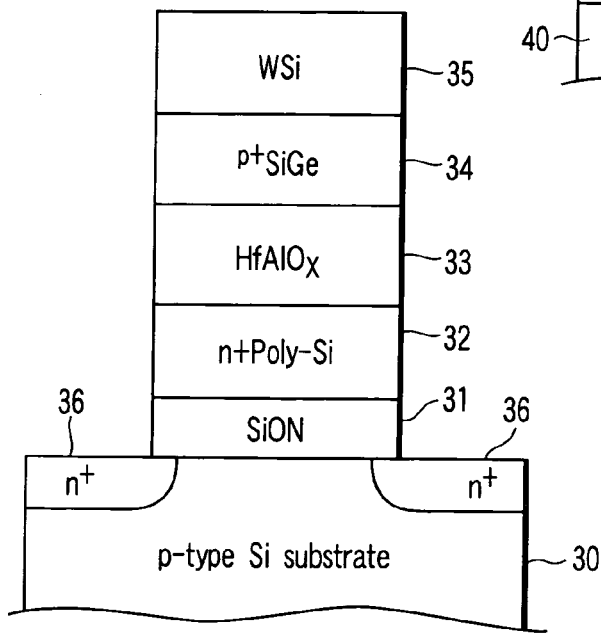
FIG. 13 is a sectional view schematically showing the structure of a nonvolatile semiconductor memory cell according to a third embodiment of this invention.

FIG. 13 is a sectional view schematically showing the structure of a nonvolatile semiconductor memory cell according to a third embodiment of this invention. Reference numbers 30 to 35 in FIG. 13 correspond to reference numbers 10 to 15 in FIG. 9, respectively. However, the components 34 are a SiGe layer, unlike the component 14 of the first embodiment.

This embodiment differs from the first embodiment in that the control gate electrode 34 is a $p^+$-type SiGe layer, not a $p^+$-type polycrystalline silicon layer as in the first embodiment. The SiGe layer constituting the control gate electrode 34 may be either poly-crystal or single crystal. The third embodiment is fabricated by almost the same method as the first embodiment. To form the SiGe layer, CVD using $Si_2H_6$ and $GeH_4$ as feed gases may be carried out. Further, it suffices to form various layers and films, each to the same thickness as in the first embodiment.

The $n^+$-type polycrystalline Si layer, i.e., one of the semiconductor layers that sandwich the HfAlOx layer, has work function of about 4 eV. The $p^+$-type SiGe layer, i.e., the other of the semiconductor layers that sandwich the HfAlOx layer, has work function ranging from about 4.6 eV to abut 5.2 eV, depending on the Ge concentration. SiGe is desirable, because it exhibits a high activation rate and can suppress depletion layers more readily than polycrystalline Si.

In this configuration, too, the charge trap/de-trap after the application of a voltage can be decreased because the high-permittivity insulating film made of HfAlOx used as inter-electrode insulating film 33 is interposed between the $n^+$-type polycrystalline Si layer used as floating gate electrode 32 and the $p^+$-type SiGe layer used as control gate electrode 34. Thus, this embodiment can attain the same advantage as the first embodiment. In addition, since a $p^+$-type SiGe layer is used as control gate electrode 34 in this embodiment, the number of holes to be injected can therefore be best controlled by selecting an appropriate value for Ge concentration. Hence, the charge trap/de-trap after the application of a voltage can be further decreased in the present embodiment.

Fourth Embodiment

Figure 14:
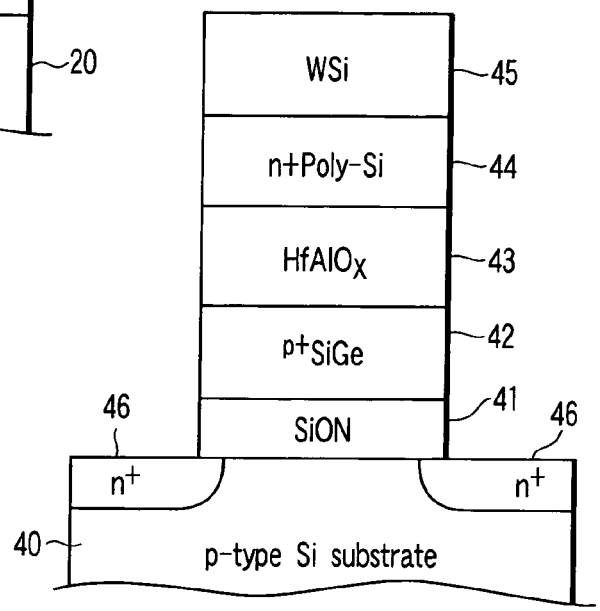
FIG. 14 is a sectional view schematically showing the structure of a nonvolatile semiconductor memory cell according to a fourth embodiment of this invention.

FIG. 14 is a sectional view schematically showing the structure of a nonvolatile semiconductor memory cell according to a fourth embodiment of this invention. Reference numbers 40 to 45 in FIG. 14 correspond to reference numbers 20 to 25 in FIG. 12, respectively. However, the component 42 is a SiGe layer, unlike the component 22 of the second embodiment.

This embodiment differs from the second embodiment in that the floating gate electrode 42 is a $p^+$-type SiGe layer, not a $p^+$-type polycrystalline Si layer as in the second embodiment. That is, the floating gate electrode 42 and the control gate electrode 44 have conductivity types opposite to those of their counterparts of the third embodiment.

The SiGe layer that constitutes the floating gate 32 may be either poly-crystal or single crystal. The fourth embodiment is fabricated by almost the same method as the first embodiment. To form the SiGe layer, CVD using $Si_2H_6$ and $GeH_4$ as feed gases may be carried out. Moreover, it suffices to form various layers and films, each to the same thickness as in the first embodiment.

In this configuration, too, the charge trap/de-trap after the application of a voltage can be decreased, because the high-permittivity insulating film made of HfAlOx used as inter-electrode insulating film 43 is interposed between the $p^+$-type SiGe layer used as floating gate electrode 42 and the $n^+$-type polycrystalline Si layer used as control gate electrode 44. Thus, this embodiment can attain the same advantage as the first embodiment. In addition, since a $p^+$-type SiGe layer is used as floating gate electrode 42 in this embodiment, the number of holes to be injected can therefore be best controlled by selecting an appropriate value for Ge concentration. Hence, the charge trap/de-trap after the application of a voltage can be further decreased in the present embodiment.

Fifth Embodiment

FIG. 15 is a sectional view schematically showing the structure of a nonvolatile semiconductor memory cell according to a fifth embodiment of this invention. Reference numbers 50 to 55 in FIG. 15 correspond to reference numbers 10 to 15 in FIG. 9, respectively.

This embodiment differs from the first embodiment in that an SiN layer 57 is interposed between a HfAlOx film used as inter-electrode insulating film 53 and an $n^+$-type polycrystalline Si layer used as floating gate electrode 52. It differs also in that the an SiN film 58 is interposed between the HfAlOx film used as inter-electrode insulating film 53 and a $p^+$-type polycrystalline Si layer used as control gate electrode 54. The SiN layers 57 and 58 are 1 nm to about 4 nm thick.

To form the SiN layers 57 and 58, an LPCVD method using dichlorosilane (DCS) and $NH_3$ as materials may be carried out. The SiN layers may be formed by another method, in which $NH_3$ nitriding or radical nitriding is performed to convert polycrystalline Si layers to SiN layers. Instead, an ADL method in which DCS are used as materials may be carried out.

In the present embodiment, SiN layers are used as layers that are interposed at interfaces between the inter-electrode insulating film 53, the $p^+$-type polycrystalline Si layer and the $n^+$-type polycrystalline Si layer. Nonetheless, $SiO_2$ layers or $Al_2O_3$ layers may be used in place of the SiN layers. That is, layers of insulating material that has a larger barrier height than high-permittivity films used as inter-electrode insulating films and exhibits asymmetrical band-offset can be utilized instead of SiN layers. This insulating material is one that controls the number of electrons/holes to be injected. In view of this, layers of this material should be arranged, particularly on the side of the $p^+$-type electrode. Therefore, the SiN layer 58 is very useful in this embodiment. The SiN layer 57 can be dispensed with.

In this embodiment, the charge trap/de-trap after the application of a voltage can be decreased, because the high-permittivity insulating film made of HfAlOx used as inter-electrode insulating film 53 is interposed between the $n^+$-type Si layer used as floating gate electrode 52 and the $p^+$-type polycrystalline Si layer used as control gate electrode 54. Thus, this embodiment can attain the same advantage as the first embodiment.

In the present embodiment, the SiN layer 58 that has a larger barrier height than high-permittivity films and exhibits asymmetrical band-offset is interposed between the inter-electrode insulating film 53 and the $p^+$-type polycrystalline Si layer used as control gate electrode 54. The number of electrons/holes to be injected can therefore be controlled. Hence, the charge trap/de-trap after the application of a voltage can be further decreased in the present embodiment.

Sixth Embodiment

FIG. 16 is a sectional view schematically showing the structure of a nonvolatile semiconductor memory cell according to a sixth embodiment of the present invention. Reference numbers 60 to 65 in FIG. 16 correspond to reference numbers 20 to 25 in FIG. 12, respectively.

This embodiment differs from the second embodiment in that a $SiO_2$ film 67 is interposed between the HfAlOx film used as inter-electrode insulating film 63 and the $p^+$-type polycrystalline Si layer used as floating gate electrode 62. That is, the floating gate electrode 62 and the control gate electrode 64 have conductivity types opposite to those of their counterparts of the second embodiment. This embodiment is a structure in which SiO2 is used in place of SiN.

The $SiO_2$ film 67 is 1 nm to about 4 nm thick. To form the $SiO_2$ film 67, it suffices to employ either oxidation or radical oxidation of polycrystalline Si. Another method that can be used to form the $SiO_2$ film 67 may be an ALD method that uses trisdimethyl amino silane (TDMAS) and ozone as materials.

Thus, the HfAlOx film used as inter-electrode insulating film 63 is interposed between the $p^+$-type polycrystalline Si layer used as floating gate electrode 62 and the $n^+$-type polycrystalline Si layer used as control gate electrode 64 in the present embodiment. The charge trap/de-trap after the application of a voltage can be therefore decreased. Thus, this embodiment can attain the same advantage as the first embodiment.

In the present embodiment, the $SiO_2$ layer 67 that has a larger barrier height than high-permittivity films and exhibits asymmetrical band-offset is interposed between the inter-electrode insulating film 63 and the $p^+$-type polycrystalline Si layer used as floating gate electrode 62. The number of electrons/holes to be injected can therefore be controlled. This embodiment can therefore achieve the same advantage as the fifth embodiment.

Seventh Embodiment

Figure 17:
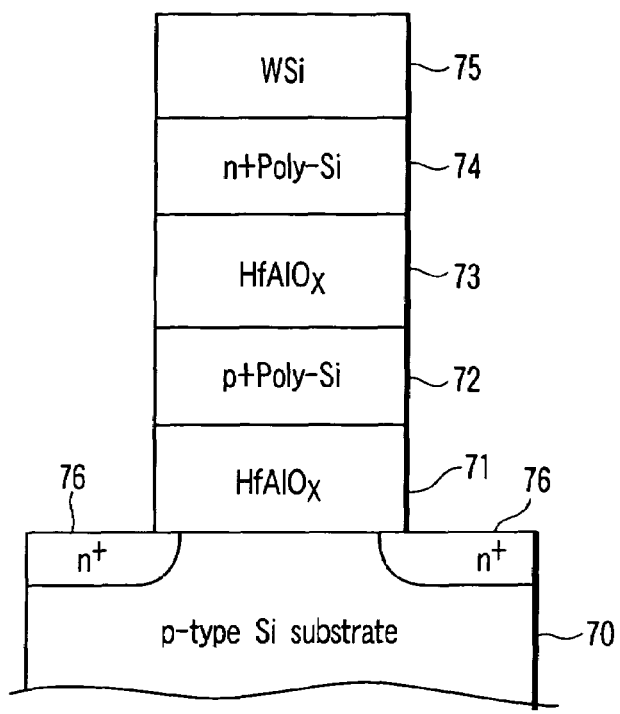
FIG. 17 is a sectional view schematically showing the structure of a nonvolatile semiconductor memory cell according to a seventh embodiment of this invention.

FIG. 17 is a sectional view schematically showing the structure of a nonvolatile semiconductor memory cell according to a seventh embodiment of this invention. Reference numbers 70 to 75 in FIG. 17 correspond to reference numbers 20 to 25 in FIG. 12, respectively.

As FIG. 17 shows, a floating gate 72 made of $p^+$-type polycrystalline Si is formed on a $p^+$-type Si substrate 70 through a tunnel insulating film 71 made of HfAlOx. On the floating gate electrode 72 there is formed an inter-electrode insulating film 73 made of HfAlOx that has higher Hf concentration than the material, HfAlOx, of the tunnel insulating film 71. A lower control gate electrode 74 made of $n^+$-type polycrystalline Si is formed on the inter-electrode insulating film 73, and an upper control gate electrode 75 made of W slicide is formed on the lower control gate electrode 74.

The HfAlOx film, i.e., tunnel insulating film 71, is 10 nm to about 30 nm thick. The $n^+$-type polycrystalline Si layer and the $p^+$-type polycrystalline Si layer are 30 nm to about 60 nm thick. The HfAlOx film, i.e., inter-electrode insulating film 73, is 10 nm to about 30 nm thick. As is known in the art, $n^+$-type polycrystalline Si and $p^+$-type polycrystalline Si have work function of about 4 eV and work function of about 5 eV, respectively. The resistivity of W silicide is lower than that of $n^+$-type polycrystalline Si.

The HfAlOx film used as tunnel insulating film 71 is interposed between the p-type Si substrate 70 and the $p^+$-type polycrystalline Si layer 72. While the element works, the channel in the p-type Si substrate 70 has conductivity type n. This is why the tunnel insulating film 71 is interposed between a p-type electrode and an n-type electrode, almost like the inter-electrode insulating film 73.

In the present embodiment, the control gate electrode 74 is made of $n^+$-type polycrystalline Si. Instead, it may be made of metal selected from the group consisting of Au, Pt, Co, Be, Ni, Rh, Pd, Te, Re, Mo, Al, Hf, Ta, Mn, Zn, Zr, In, Bi, Ru, W, Ir, Er, La, Ti and Y or metal compound that contains at least one element selected from this group. Alternatively, the electrode 74 may be made of metal-based conductive material such as silicide, boride, nitride or carbide of any metal selected from this group.

In this embodiment, the floating gate electrode 72 is made of $p^+$-type polycrystalline Si. Instead, the electrode 72 may be made of a Ge layer or made of $p^+$-type semiconductor material in which Ge added to Si.

In this embodiment, the layer 75, which is used as control gate electrode and laid on the $n^+$-type polycrystalline Si layer, is made W silicide. Instead, the layer 75 may be made of low-permittivity silicide, such as Ni silicide or Co silicide, or made of various metal-based conductive materials.

In the present embodiment, the high-permittivity tunnel insulating film 71 and the inter-electrode insulating film 73 are made of HfAlOx. Instead, the films 71 and 73 may be made of oxide, nitride or oxinitride that contains at least one element selected from the group consisting of Al, Hf, La, Y, Ce, Ti, Zr, Si and Ta, or may be a multi-layer structure that is composed of these films. Alternatively, a multi-layer structure composed of these high-permittivity insulating films and a silicon oxide film, a silicon oxinitride film or a silicon nitride film may be utilized. Further, interface layers, each made of a very thin insulating film, may be provided at the interfaces between these high-permittivity insulating films, the control gate electrode and the floating gate electrode.

This embodiment is fabricated by a method that is basically the same method as the first embodiment. Therefore, only the features characterizing this embodiment will be described below.

The tunnel insulating film 71 made of HfAlOx film 109 was formed by means of the ALD method at 250° C., by using $Al(CH_3)_3$, $Hf[N(CH_3)_2]_4$ and $H_2O$ as materials. Subsequently, annealing was carried out at 1000° C. in an $N_2$ atmosphere of 1 atmospheric pressure. The floating gate electrode 72 was formed in the same way as in the first embodiment. That is, the electrode 72 was formed by depositing phosphor-doped polycrystalline Si by means of CVD at 620° C.

The inter-electrode insulating film 73 made of HfAlOx was formed in the same way as in the first embodiment. That is, the film 73 was formed by means of the ALD method at 250° C., by using $Al(CH_3)_3$, $Hf[N(CH_3)_2]_4$ and $H_2O$ as materials. Subsequently, annealing was performed at 1000° C. in an $N_2$ atmosphere of 1 atmospheric pressure.

The control gate electrode 74 was formed by depositing boron-doped polycrystalline Si at 620° C. by means of CVD. Further, the control gate electrode 75 made of WSi was formed first by forming a W layer by CVD using $W(CO)_6$ as feed gas and then by performing a heating process, converting the polycrystalline silicon layer to a WSix layer.

The methods of forming these films are not limited to those described above. Other feed gases may be used. Further, instead of ALD and CVD, other methods, such as sputtering, vapor deposition, laser abrasion, MBE method, or any possible combination of these methods, may be performed.

Thus, the high-permittivity insulating film of HfAlOx, used as tunnel insulating film 71, is interposed between the $n^+$-type source/drain region 76 provided on the p-type Si substrate 71 and the $p^+$-type polycrystalline Si layer used as floating gate electrode 72 in the present embodiment. The charge trap/de-trap after the application of a voltage can be therefore decreased. In addition, the high-permittivity insulating film of HfAlOx, which is used as inter-electrode insulting film 73, is interposed between the $p^+$-type polycrystalline Si layer used as floating gate electrode 72 and the $n^+$-type polycrystalline Si layer used as the control gate electrode 74. The charge trap/de-trap after the application of a voltage can be therefore decreased.

Thus, the charge trap/de-trap after the application of a voltage can be reduced in both the tunnel insulating film 71 and the inter-electrode insulating film 74.

Eighth Embodiment

Figure 18:
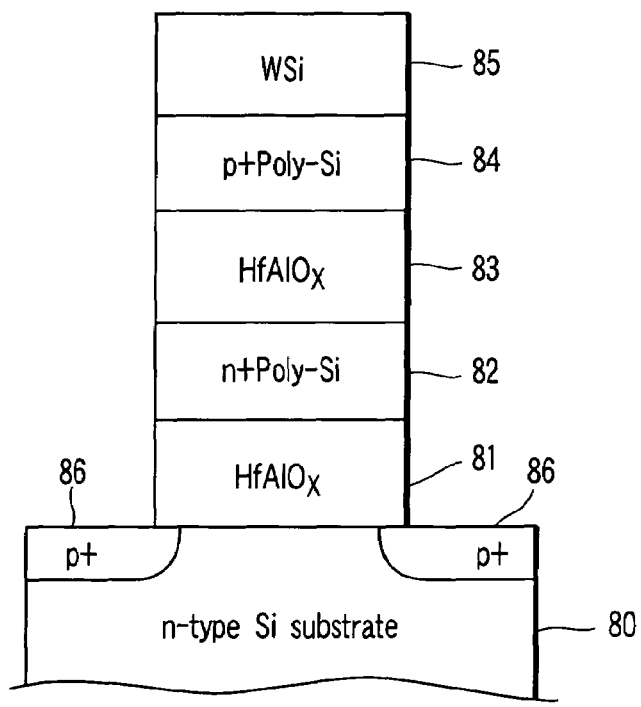
FIG. 18 is a sectional view schematically showing the structure of a nonvolatile semiconductor memory cell according to an eighth embodiment of the present invention.

FIG. 18 is a sectional view schematically showing the structure of a nonvolatile semiconductor memory cell according to an eighth embodiment of the present invention. Reference numbers 80 to 85 in FIG. 18 correspond to reference numbers 70 to 75 in FIG. 17, respectively.

This embodiment differs from the seventh embodiment in that the substrate and the various layers conductivity types opposite to those of their counterparts of the seventh embodiment. More precisely, a floating gate 82 made of $n^+$-type polycrystalline Si is formed on an $n^+$-type Si substrate 80 through a tunnel insulating film 81 made of HfAlOx. On the floating gate electrode 82 there is formed an inter-electrode insulating film 83 made of HfAlOx that has higher Hf concentration than the material, HfAlOx, of the tunnel insulating film 81. A control gate electrode composed of a $p^+$-type polycrystalline Si layer 84 and a W silicide layer 84 is formed on the inter-electrode insulating layer 83.

Thus, this embodiment differs from the seventh embodiment only in the conductivity types of layers, and is similar in basic structure to the seventh embodiment. Its constituting layers have the same thickness as their counterparts of the seventh embodiment. This embodiment is fabricated in basically the same method as the seventh embodiment.

In the present embodiment, the floating gate electrode 82 is made of $n^+$-type polycrystalline Si. Instead, it may be made of metal selected from the group consisting of Au, Pt, Co, Be, Ni, Rh, Pd, Te, Re, Mo, Al, Hf, Ta, Mn, Zn, Zr, In, Bi, Ru, W, Ir, Er, La, Ti and Y or metal compound that contains at least one element selected from this group. Alternatively, the electrode 82 may be made of metal-based conductive material such as silicide, boride, nitride or carbide of any metal selected from this group.

In this embodiment, the control gate electrode 84 is made of $p^+$-type polycrystalline Si. Instead, the electrode 84 may be made of a Ge layer or made of $p^+$-type semiconductor material in which Ge added to Si.

In this embodiment, the layer 85, which is used as control gate electrode and laid on the $n^+$-type polycrystalline Si layer, is made W silicide. Instead, the layer 85 may be made of low-permittivity silicide, such as Ni silicide or Co silicide, or made of various metal-based conductive materials.

In the present embodiment, the high-permittivity tunnel insulating film 81 and the inter-electrode insulating film 83 are made of HfAlOx. Instead, the films 81 and 83 may be made of oxide, nitride or oxinitride that contains at least one element selected from the group consisting of Al, Hf, La, Y, Ce, Ti, Zr, Si and Ta, or may be a multi-layer structure that is composed of these films. Alternatively, a multi-layer structure composed of these high-permittivity insulating films and a silicon oxide film, a silicon oxinitride film or a silicon nitride film may be utilized. Moreover, interface layers, each made of a very thin insulating film, may be provided at the interfaces between these high-permittivity insulating films, the control gate electrode and the floating gate electrode.

Thus, the high-permittivity insulating film of HfAlOx, used as tunnel insulating film 81, is interposed between the $p^+$-type source/drain region 86 provided on the n-type Si substrate 81 and the n⁺-type polycrystalline Si layer used as floating gate electrode 82 in the present embodiment. The charge trap/de-trap after the application of a voltage can be therefore decreased. In addition, the high-permittivity insulating film of HfAlOx, which is used as inter-electrode insulting film 83, is interposed between the n⁺-type polycrystalline Si layer used as floating gate electrode 82 and the p⁺-type polycrystalline Si layer used as the control gate electrode 84. The charge trap/de-trap after the application of a voltage can be therefore decreased.

Thus, the charge trap/de-trap after the application of a voltage can be reduced in both the tunnel insulating film 81 and the inter-electrode insulating film 84. The present embodiment can therefore achieve the same advantage as the seventh embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
    a tunnel insulating film which is formed on a surface of a semiconductor substrate;
    a floating gate electrode which is formed on the tunnel insulating film, at least an interface region which the floating gate electrode defines on a side opposite to that of the substrate, being made of n-type Si or metal-based conductive material;
    an inter-electrode insulating film which is formed on the floating gate electrode and which is made of high-permittivity material, the high-permittivity material being oxide, nitride or oxinitride containing at least one element selected from the group consisting of Al, Hf, La, Y, Ce, Ti, Zr, Si, and Ta;
    a control gate electrode which is formed on the inter-electrode insulating film, at least an interface region of which the control gate electrode defines on a side of the inter-electrode insulating film, being made of a p-type semiconductor layer containing at least one of Si and Ge; and
    an n-type source/drain region formed in the surface of the semiconductor substrate.

2. The memory device according to claim 1, further comprising an n-type Si layer or a metal-based conductive layer which is interposed at an interface between the inter-electrode insulating film and the floating gate electrode, and a p-type semiconductor layer containing at least one of Si and Ge which is interposed between the inter-electrode insulating film and the control gate electrode.

3. The memory device according to claim 1, wherein the floating gate electrode is made of an n-type Si layer or a metal-based conductive layer, and the control gate electrode is made of a p-type semiconductor layer containing at least one of Si and Ge.

4. The memory device according to claim 1, wherein the floating gate electrode is made of an n-type polycrystalline Si layer, and the control gate electrode is made of a p-type polycrystalline Si layer.

5. The memory device according to claim 1, wherein the metal-based conductive material is metal selected from the group consisting of Au, Pt, Co, Be, Ni, Rh, Pd, Te, Re, Mo, Al, Hf, Ta, Mn, Zn, Zr, In, Bi, Ru, W, Ir, Er, La, Ti and Y;
    metal compound containing at least one element selected from this group, or
    silicide, boride, nitride or carbide of any metal selected from this group.

6. The memory device according to claim 3, wherein an insulating-material film having a larger barrier height than the inter-electrode insulating film and exhibiting asymmetrical band-offset is interposed at an interface between the p-type semiconductor layer forming the control gate electrode and the inter-electrode insulating film.

7. The memory device according to claim 1, wherein the high-permittivity material forming the inter-electrode insulating film is hafnium aluminate, lanthanum aluminate, HfAlON, or LaAlON.

* * * * *

UNITED STATES PATENT AND TRADEMARK OFFICE
CERTIFICATE OF CORRECTION

PATENT NO. : 7,550,801 B2  Page 1 of 1
APPLICATION NO. : 11/433422
DATED : June 23, 2009
INVENTOR(S) : Kikuchi et al.

It is certified that error appears in the above-identified patent and that said Letters Patent is hereby corrected as shown below:

Claim 1, column 15, line 42, change "region of" to --region--.

Claim 7, column 16, line 40, change "HfAION, or LaAION." to --HfAlON, or LaAlON.--.

Signed and Sealed this

Eighteenth Day of August, 2009

David J. Kappos
*Director of the United States Patent and Trademark Office*